United States Patent [19]
Takahashi et al.

[11] Patent Number: 5,969,802
[45] Date of Patent: Oct. 19, 1999

[54] EXPOSURE APPARATUS

[75] Inventors: Tetsuo Takahashi, Yokohama; Shigeo Mizoroke, Mito; Yasuhiro Omura, Tokio, all of Japan

[73] Assignee: Nikon Corporation, Tokyo, Japan

[21] Appl. No.: 09/088,140

[22] Filed: Jun. 1, 1998

[30] Foreign Application Priority Data

Jun. 5, 1997 [JP] Japan ................................. 9-164955

[51] Int. Cl.$^6$ .......................... G03B 27/54; G03B 27/42; G03B 9/60
[52] U.S. Cl. ................. 355/67; 355/53; 359/765
[58] Field of Search ...................... 355/30, 50, 53, 355/55, 67, 77, 72; 359/765, 766; 250/548; 356/399, 400, 401

[56] References Cited

U.S. PATENT DOCUMENTS

| | | | |
|---|---|---|---|
| 4,616,908 | 10/1986 | King ........................................ | 350/576 |
| 4,766,309 | 8/1988 | Kudo .................................. | 250/237 R |
| 4,922,290 | 5/1990 | Yoshitake et al. ........................ | 355/53 |
| 5,025,284 | 6/1991 | Komoriya et al. ........................ | 355/53 |
| 5,559,584 | 9/1996 | Miyaji et al. .............................. | 355/73 |
| 5,696,623 | 12/1997 | Fujie et al. .............................. | 359/350 |

*Primary Examiner*—Safet Metjahic
*Assistant Examiner*—Hung Henry Nguyen
*Attorney, Agent, or Firm*—Chapman And Cutler

[57] ABSTRACT

An exposure apparatus for transferring a pattern on a mask (M) onto a photosensitive substrate (W) via a projection-optical system can reduce gas fluctuation even if the length of the optical path through gas is relatively long, and even if the diameter of light flux through the gas is relatively large.

The projection-optical system satisfies the condition $$(1/\lambda)\sum_i (Li)^{1/2} \cdot Ri > 1.39 \cdot 10^6 \quad (m^{1/2})$$

where $\lambda$ is a wavelength of exposure light used in the apparatus, $\Sigma i$ is a summary of gas sections i in an optical path from the mask to the photosensitive substrate, Li is a length of a gas section i along the optical axis, in m, and Ri is an average of a mask-side diameter and a substrate-side diameter of a light flux in each gas section, the light flux emerging from a maximum image height and advancing within meridional plane, wherein at least one gas section i is filled with helium or neon.

20 Claims, 5 Drawing Sheets

............ 193.305nm
--·--·-- 193.3025nm
———— 193.3nm
-------- 192.2975nm
—··—··— 192.295nm

Y=17.6    0.0020

-0.0020

Y=11.3    0.0020

-0.0020

Y=4.9    0.0020

-0.0020

EXPOSURE APPARATUS

BACKGROUND OF THE INVENTION

1. Field of Invention

This invention relates to an exposure apparatus, and more particularly to an exposure apparatus in which optical elements, including refracting elements, and gas gaps are arranged along the optical path extending from a mask to a photosensitive substrate, where the portion of the optical path occupied by the air gaps is relatively long.

2. Description of Related Art

In manufacturing of semiconductor wafers using an exposure apparatus, a demand for more minute patterns and further improved image quality has been arising. An example of such high-quality exposure apparatus is disclosed in Japanese Patent Publication (after Examination) No. 7-11512. In this publication, reflecting elements are used as a part of the projection-optical system in order to increase the optical path length without increasing the mechanical dimensions of the projection-optical system, thereby satisfactorily correcting the coma, the field curvature, and the distortion of the system.

Meanwhile, a change of the environmental temperature of the projection-optical system surrounding causes the image quality to deteriorate due to the fluctuation of the index of refraction of the air. To overcome this problem, U.S. pat. No. 4,616,908 discloses a technique for reducing the variation of the index of refraction by filling the environmental space surrounding the projection-optical system (i.e., the microlithographic system) with helium gas.

However, the U.S. Pat. No. 4,616,908 does not disclose the practical and preferable range of the total length of the projection-optical system, or the preferable wavelength of the light beam used in that projection-optical system. For this reason, it is not clear from the description what is the optimum condition of the gas section filled with helium gas for obtaining the optimum resolution. In addition, the invention disclosed in this publication is applied, according to its embodiment, to projection-optical systems that consist of only refracting optical elements. In general, a microlithographic system consisting of only refracting optical elements inherently has less deterioration of image quality due to the air fluctuation.

In contrast, a projection-optical system having reflecting elements, which has a long path length and a high numerical aperture (N.A.), has a large wavefront aberration due to the air fluctuation because the volume occupied by the air gap and the diameter of the light flux become large in the optical path. U.S. Pat. No. 4,616,908 does not teach the practical analysis of the relation between the volume of the air gap in the optical path and the aberrations.

SUMMARY OF THE INVENTION

Therefore, it is an object of the present invention to provide an exposure apparatus that can efficiently reduce the air fluctuation, while projecting the mask pattern with less aberrations, even though the total length of the gas sections and the diameter of light flux in the optical path are relatively large. Such an exposure apparatus is provided by analyzing the relation between the aberrations and the volume of the gas section occupying the optical path.

In order to achieve the object, an exposure apparatus for transferring a pattern formed on a mask onto a photosensitive substrate by a projection-optical system is provided according to the invention. The projection-optical system satisfies the following condition:

$$(1/\lambda)\sum_i (Li)^{1/2} Ri > 1.39 \cdot 10^6 \quad (m^{1/2}) \tag{1}$$

where $\lambda$ is the wavelength of exposure light used in the apparatus, $\Sigma i$ is the summary of i gas sections in the optical path from the mask to the photosensitive substrate, $Li$ is the length of a gas section i along the optical axis, and $Ri$ is the average of the mask-side diameter and the substrate-side diameter of a light flux emerging from the maximum image height and lying within the meridional plane in each gas section i. One or more gas sections i of the gas sections in the optical path are filled with helium gas, or neon.

The light flux emerging from the maximum image height is considered in the above-mentioned condition because, in general, it has the largest diameter.

In general, the gas fluctuation causes aberrations because the index of refraction of the gas varies due to the temperature fluctuation and the density fluctuation of the gas. The relation between the index of refraction and the density of a gas is defined by the Gladstone-Dale equation:

$$n-1=K\rho, \tag{a}$$

where n is the index of refraction, K is a constant, and $\rho$ is the density of the gas. That is, (n-i) is proportional to the density $\rho$.

The longer is the optical path length in the gas, through which the light flux passes, and the greater the diameter of the light flux, the larger are the aberrations due to the gas fluctuation. If the gas is the air, then the wave aberration due to the air fluctuation is expressed by equation:

$$\sigma=0.57 K \cdot L^{1/2} R(\lambda 0/\lambda) \tag{b}$$

where $\sigma$ is the standard deviation of the phase fluctuation (unit /degree), K is a constant determined by the environment of the projection-optical system, L is the length of the optical path, in m, R is the light flux diameter, in mm, $\lambda$ is the wavelength of the exposure light used in the apparatus, and $\lambda 0$ is the wavelength (633 nm) of a He-Ne laser. ("Japanese Journal of Optics", vol. 14, 1985, pp. 276)

In order to obtain the optimum resolution for the used wavelength, $\sigma$ must be less than 15°:

$$\sigma<15° \tag{c}$$

If equation (b) is applied to a general projection-optical system, K is set to 0.03 because the temperature change in the projection-optical system is generally within 0.1° C. If L is in meters and $\lambda 0$ is in nanometers, then, inequality (d) is obtained from conditions (b) and (c):

$$(L^{1/2}R)/\lambda<1.39\cdot 10^6 (m^{1/2}) \tag{d}$$

Unless inequality (d) is satisfied, it is impossible for an optical system to achieve the optimum resolution in the air. Accordingly, the optical system that satisfies the inequality (1) can not obtain the optimum resolution in the atmospheric environment. In inequalities (d) and (1), L has a value in meters, while R and $\lambda$ may not be necessarily consistent. If R is in meters, while $\lambda$ is in nanometers, then the resultant value of R/$\lambda$ is simply multiplied by $10^9$.

Because an optical system that has a long optical path and a large light flux diameter can hardly achieve the optimum resolution in the air environment, the present invention uses helium gas, or neon gas to fill some of the gas sections between the optical elements in order to achieve the optimum resolution.

The absolute index of refraction of helium, neon, and air is as follows:

$n_{He}=1.00003$ $n_{Ne}=1.00008$ $n_a=1.0003$

The influence of gas fluctuation (i.e., occurrence of phase fluctuation) in the helium gas is $\frac{1}{10}$ of that in the air. If neon gas is used, the influence of fluctuation decreases to $\frac{1}{3.75}$. Thus, deterioration of the image quality is greatly reduced.

This invention is especially effective in the photolithographic process where the ultra-violet rays having a wavelength of 300 nm, or less, are used, in which a more minute resolving power and a more perfect image quality are required.

In the optical system having reflecting elements, the projected light passes the same space twice along the forward path and the return path. Accordingly, if there is disturbance in the optical path, the influence is doubled. For this reason, it is preferable to fill up the spaces in which light flux passes twice with helium gas, or neon gas.

In the practical aspect, it is difficult to completely substitute the air with helium gas or neon gas because of the difficulty of achieving a perfect airtightness. To overcome this point, a gas supply means for supplying helium, or neon gas, is provided in order to compensate for leaking gas. The gas supply/discharge means may also be used to adjust the gas pressure of helium or neon.

Preferably, the partial pressure x(%) of helium or neon is set so that the gas fluctuation becomes $\frac{1}{3}$ of that in the atmospheric environment. That is, the partial pressure x(%) is set so as to satisfy the condition:

$$[(n-1)x+(n_a-1)(100-x)]/100 < (n_a-1)/3 \quad (e)$$

where x is the partial pressure (%) of helium or neon, n is the index of refraction of helium or neon, and $n_a$ is the index of refraction of the air.

Accordingly, it is preferable for the present invention to satisfy the condition (2):

$$x > 200(n_a-n)/3(n_a-n) \quad (2)$$

If the index of refraction for helium, neon, and air ($n_{He}=00003$, $n_{Ne}=00008$, and $n_{air}=1.0003$) is inserted into inequality (2), the following inequalities can be obtained:

$$x > 74\% \text{ for helium} \quad (2a)$$

$$x > 91\% \text{ for neon} \quad (2b)$$

By keeping the density of the helium gas, or the neon gas constant, the gas fluctuation can be reduced to less than $\frac{1}{3}$ of that in the air.

Because a helium molecule or a neon molecule is smaller than a nitrogen molecule, which is the major component of the air, it is difficult to keep the helium or neon gas in the designated space. If the total pressure in that gas section is lower than the atmospheric pressure, the air flows into the space filled with the helium or neon gas. To prevent this air flow, a material having a low transmissivity to the air is inserted in the boundary between the gas section filled with the helium or neon gas and the external space, thereby isolating the gas section from the air. In this arrangement, the total pressure of the gas section may be lower than the atmospheric pressure.

The gap filled with the helium or neon gas should be completely sealed with a sealing material. Metallic seal is not appropriate if the object to be sealed is an optical element because the optical element may be deformed by the metallic seal. As a result, the correction of fluctuation of the index of refraction is canceled out by deterioration of exposure quality due to the deformation of the optical element.

In this invention, elastomer seal is preferably used in order to avoid deformation of the optical element. By appropriately selecting the quality of the material and the conditions of use, the space filled with helium can be sealed excellently. Examples of elastomer include fluorocarbon rubber, nitrile rubber, polyethylene chlorosulfonate rubber, butyl rubber, chloroprene rubber, epichlorohydrin rubber, uretane rubber, and polysulfide rubber, all of which have low gas-transmissivities.

All or a part of the gas sections in the optical path from the mask to the photosensitive substrate may be filled with helium, or neon gas. The exposure apparatus may include means for controlling the optical characteristics of the system by adjusting the mixture ratio of the mixed gas (which is disclosed by, for example, Japanese Patent Publication No. 5-144700). In this case, the absolute index of refraction of the gas in the lens controller may be preferably large, depending on the case, and several helium or neon gas sections are preferably distributed over the optical path.

If the adjustment mechanism within the lens system is controlled by an operator, the sections to be adjusted are preferably left with the atmosphere air, because if such sections are filled with helium or neon gas, the operation becomes difficult.

BRIEF DESCRIPTION OF THE DRAWINGS

The above and other objects, features, and advantages of the invention will be apparent from the detailed description which follows by way of exemplary embodiments of the invention with reference to the attached drawings, which are here described.

DETAILED DESCRIPTION OF THE PREFERRED EMBODIMENTS

The preferred embodiments of the invention will now be described in detail with reference to the attached drawings.

Figure 1:
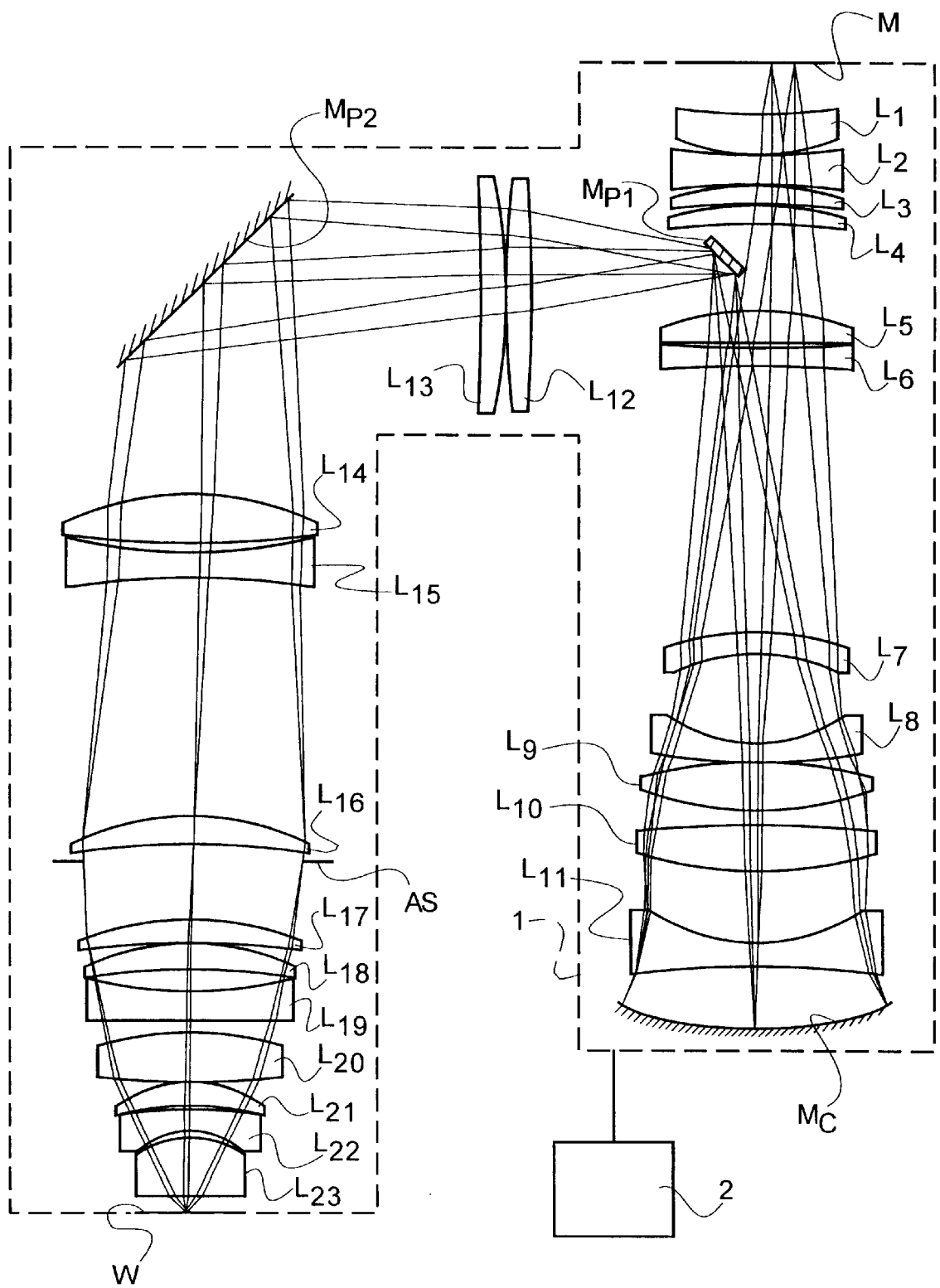
FIG. 1 is a cross-sectional view of the exposure apparatus according to the first embodiment of the invention.

FIG. 1 illustrates the exposure apparatus according to the first embodiment of the invention. In this embodiment, the projection-optical system is a reflecting/refracting, or catadioptric, optical system. Light flux emitted from the pattern on the mask M is transmitted through lenses L1–L4 and L5–L11, reflected from a concave mirror Mc, and transmitted through the lenses L11–L5 in the opposite direction. This light flux is then reflected by a first plane mirror Mp1 which is positioned between the lenses L4 and L5, and it forms an intermediate image near the first plane mirror Mp1. The light flux further passes through lenses L12 and L13, and it is reflected by a second plane mirror Mp2. The reflected light further passes through lenses L14–L16, an aperture stop AS, and lenses L17–L23, and refocuses the pattern image on the photosensitive substrate W. In this optical system, three lenses L9, L14 and L22 are made of fluorite CaF$_2$, and the other lenses are made of quartz glass SiO$_2$.

As shown in FIG. 1, the entire optical path from the mask M to the photosensitive substrate W is enclosed in the sealed container 1. A helium supply apparatus 2 is connected to the sealed container 1 in order to supply and discharge helium (He) gas into and from the container 1.

Figure 3:
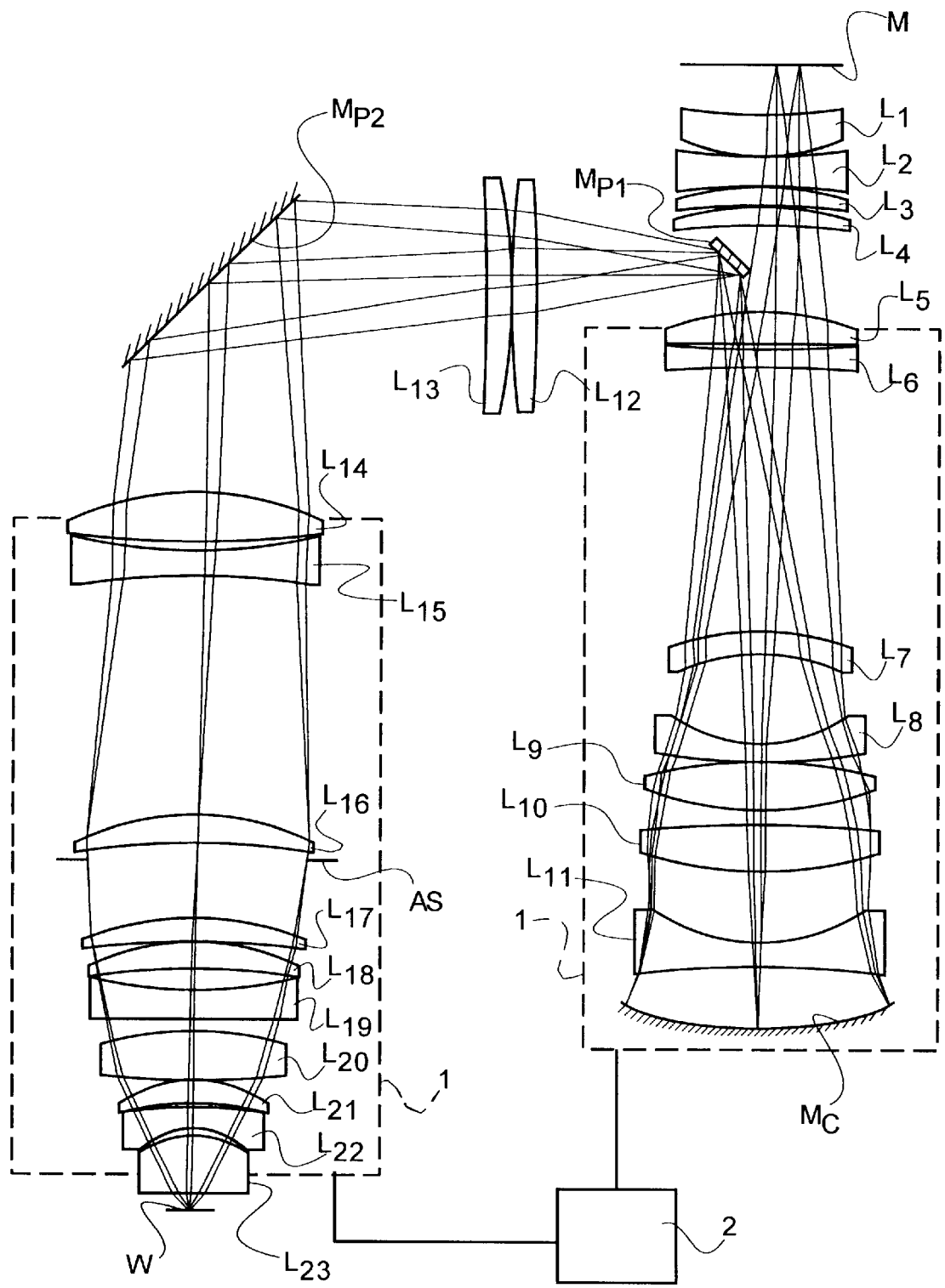
FIG. 3 is a cross-sectional view of the exposure apparatus according to the second embodiment of the invention.

FIG. 3 illustrates the exposure apparatus according to the second embodiment of the invention. The projection-optical system of this embodiment is also a catadioptric optical system. Unlike the first embodiment, a part of the optical path from the mask M to the photosensitive substrate W is kept in the helium environment, and the other part of the path is in the atmospheric environment. In particular, the path from the mask M to the lens L5, and the path from the first plane mirror Mc1 to the lens L14 are left in the air because these portions are used to adjust the system. On the other hand, the path from the lens L6 to the concave mirror Mc is kept in the helium environment because this part is the round-trip path, and because the diameter of the light flux becomes relatively large. Similarly, the path from the lens L14 to the lens L23 is also kept in the helium environment because the diameter of the light flux in this part is relatively large.

In both the first and second embodiments, an ArF laser having a wavelength λ=193.3nm is used as the light source. The maximum image height is 17.6 mm, and the numerical aperture (N.A.) is 0.65.

Figure 5:
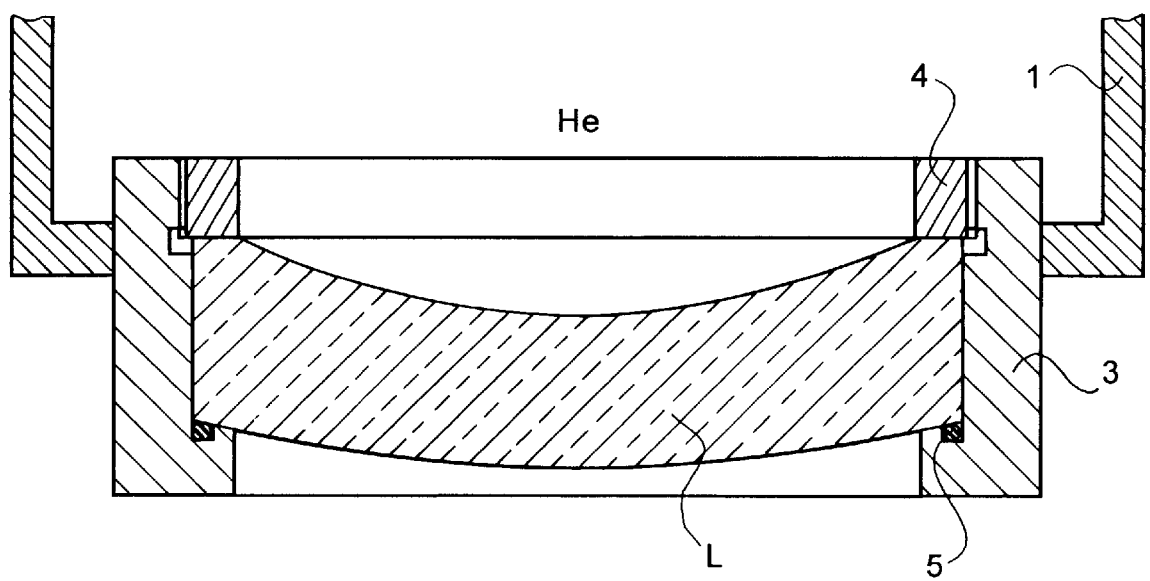
FIG. 5 is an enlarged cross-sectional view of the sealing part between the air-tight container and the lens.

FIG. 5 is an enlarged view of the sealing part between the container 1 and the lens L. The lens fixing part 4 is screwed into a lens holder 3 so as to clamp the rim of the lens L from the both surfaces. An O-ring 5 made of an elastomer is inserted between the lens holder 3 and the lens L for the purpose of airtight sealing. This sealing structure is also employed in the second embodiment, between the lens L5 and the container 1, and between the lens L14 and another container 1.

Tables 1 and 2 show the various parameters in the first and second embodiments, respectively. In the tables, the first column represents the surface number serially assigned to all the optical surfaces from the mask side, the second column represents the radius of curvature "r" of each optical surfaces, the third column represents the on-axis distance "d" between two adjacent surfaces, the fourth column represents the diameter of the light flux at the associated optical surface, the light flux being emitted from the maximum image height and advancing within the meridional plane, the fifth column represents the medium filling the space defined by the associated surface and the next surface, and the sixth column represents the optical elements or planes.

In the third column, the negative sign before the numerical value indicates the direction opposite to the forward path. In other words, wherever the light is reflected, the sign is inverted.

Ri in inequality (1) is an average value of two R values in the fourth column, the associated surfaces of which define each gas section. The actual value of the left term of inequality (1) is the same in the first and second embodiments, which is equal:

$$(1/\lambda)\sum_{i} (Li)^{1/2} \cdot Ri = 8.68 \cdot 10^6 \quad (m^{1/2})$$

The indexes of refraction of quartz glass (SiO$_2$), fluorite (CaF$_2$), and helium (He) relative to the air is as follows:

TABLE 1

Quartz glass (SiO$_2$)  1.56033
Fluorite (CaF$_2$)  1.50146
Helium (He) gas  0.99972

| | r | d | R | | |
|---|---|---|---|---|---|
| 0 | ∞ | 54.138 | 0.000 | He | M |
| 1 | −746.473 | 41.390 | 16.519 | SiO$_2$ | L1 |
| 2 | −332.371 | 0.500 | 24.375 | He | |
| 3 | −674.926 | 31.592 | 25.584 | SiO$_2$ | L2 |
| 4 | 593.832 | 0.500 | 33.763 | He | |
| 5 | 342.304 | 20.066 | 35.462 | SiO$_2$ | L3 |
| 6 | 770.724 | 0.500 | 38.474 | He | |
| 7 | 362.878 | 20.000 | 39.889 | SiO$_2$ | L4 |
| 8 | 615.366 | 89.336 | 42.799 | He | |
| 9 | 349.889 | 30.000 | 69.158 | SiO$_2$ | L5 |
| 10 | 2537.387 | 7.429 | 72.929 | He | |
| 11 | −1064.804 | 20.000 | 74.662 | SiO$_2$ | L6 |
| 12 | 8587.637 | 273.343 | 77.557 | He | |
| 13 | 321.243 | 20.000 | 142.379 | SiO$_2$ | L7 |
| 14 | 210.375 | 94.603 | 141.411 | He | |
| 15 | −175.004 | 20.000 | 167.991 | SiO$_2$ | L8 |
| 16 | −741.115 | 0.500 | 190.652 | He | |
| 17 | 487.758 | 50.000 | 205.845 | CaF$_2$ | L9 |
| 18 | −362.736 | 20.611 | 215.005 | He | |
| 19 | 7866.261 | 40.000 | 224.283 | SiO$_2$ | L10 |
| 20 | −468.110 | 75.337 | 228.439 | He | |
| 21 | −232.258 | 25.000 | 225.832 | SiO$_2$ | L11 |
| 22 | 1458.557 | 64.608 | 247.554 | He | |
| 23 | −390.998 | −64.608 | 272.000 | He | Mc |
| 24 | 1458.557 | −25.000 | 244.145 | SiO$_2$ | L11 |
| 25 | −232.258 | 75.337 | 220.746 | He | |
| 26 | −468.119 | −40.000 | 217.684 | SiO$_2$ | L10 |
| 27 | 7866.261 | −20.611 | 211.972 | He | |
| 28 | −362.736 | −50.000 | 200.845 | CaF$_2$ | L9 |
| 29 | 487.758 | −0.500 | 189.565 | He | |
| 30 | −741.115 | −20.000 | 175.496 | SiO$_2$ | L8 |
| 31 | −175.004 | −94.603 | 153.659 | He | |
| 32 | 210.375 | −20.000 | 119.979 | SiO$_2$ | L7 |
| 33 | 321.243 | −273.343 | 118.886 | He | |
| 34 | 8587.637 | −20.000 | 27.298 | SiO$_2$ | L6 |
| 35 | −1064.804 | −7.429 | 22.829 | He | |
| 36 | 2537.387 | −30.000 | 21.009 | SiO$_2$ | L5 |
| 37 | 349.889 | −18.021 | 15.869 | He | Mc |
| 38 | ∞ | 235.000 | 7.789 | He | Mp1 |
| 39 | 3100.975 | 25.000 | 72.555 | SiO$_2$ | L12 |
| 40 | −869.699 | 0.500 | 76.336 | He | |
| 41 | 670.101 | 27.909 | 79.076 | SiO$_2$ | L13 |
| 42 | 80335.012 | 300.000 | 82.448 | He | |
| 43 | ∞ | −200.134 | 113.330 | He | Mp2 |
| 44 | −333.604 | −49.928 | 186.842 | CaF$_2$ | L14 |
| 45 | 934.238 | −10.444 | 187.649 | He | |
| 46 | 466.018 | −25.000 | 187.765 | SiO$_2$ | L15 |
| 47 | −950.895 | −251.607 | 187.451 | He | |
| 48 | −307.589 | −30.000 | 229.864 | SiO$_2$ | L16 |
| 49 | −1085.711 | −15.000 | 227.428 | He | |
| 50 | — | −59.022 | 225.872 | He | AS |
| 51 | −289.797 | −25.000 | 211.961 | SiO$_2$ | L17 |
| 52 | −904.141 | −0.500 | 207.538 | He | |
| 53 | −233.678 | −26.099 | 199.634 | SiO$_2$ | L18 |
| 54 | −716.795 | −20.712 | 192.882 | He | |
| 55 | 472.493 | −30.000 | 188.257 | SiO$_2$ | L19 |
| 56 | −2289.505 | −15.488 | 173.628 | He | |
| 57 | −353.686 | −50.000 | 161.635 | SiO$_2$ | L20 |
| 58 | 1565.402 | −0.500 | 141.643 | He | |
| 59 | −125.148 | −23.572 | 124.832 | SiO$_2$ | L21 |
| 60 | −262.808 | −3.880 | 112.577 | He | |
| 61 | −333.152 | −20.000 | 109.432 | CaF$_2$ | L22 |
| 62 | −81.707 | −7.293 | 82.263 | He | |
| 63 | −85.000 | −60.000 | 77.358 | SiO$_2$ | L23 |
| 64 | −1466.413 | −18.811 | 31.854 | He | |
| 65 | ∞ | | 0.000 | | W |

TABLE 2

| | r | d | R | | |
|---|---|---|---|---|---|
| 0 | ∞ | 54.067 | 0.000 | Air | M |
| 1 | −742.945 | 41.493 | 16.484 | SiO$_2$ | L1 |
| 2 | −332.196 | 0.500 | 24.366 | Air | |
| 3 | −675.957 | 31.612 | 25.379 | SiO$_2$ | L2 |
| 4 | 593.243 | 0.517 | 33.765 | Air | |
| 5 | 342.029 | 20.001 | 35.474 | SiO$_2$ | L3 |
| 6 | 776.132 | 0.500 | 28.469 | Air | |
| 7 | 363.944 | 20.000 | 39.882 | SiO$_2$ | L4 |
| 8 | 615.980 | 89.399 | 42.794 | Air | |
| 9 | 349.710 | 30.000 | 69.168 | SiO$_2$ | L5 |
| 10 | 2531.555 | 7.433 | 72.939 | He | |
| 11 | −1065.315 | 20.000 | 74.673 | SiO$_2$ | L6 |
| 12 | 8614.877 | 273.325 | 77.568 | He | |
| 13 | 321.289 | 20.000 | 142.381 | SiO$_2$ | L7 |
| 14 | 210.390 | 94.695 | 141.412 | He | |
| 15 | −175.047 | 20.000 | 168.028 | SiO$_2$ | L8 |
| 16 | −741.786 | 0.500 | 190.697 | He | |
| 17 | 487.738 | 50.000 | 205.896 | CaF$_2$ | L9 |
| 18 | −362.674 | 20.589 | 215.051 | He | |
| 19 | 7584.087 | 40.000 | 224.327 | SiO$_2$ | L10 |
| 20 | −469.166 | 75.379 | 228.473 | He | |
| 21 | −232.353 | 25.000 | 225.861 | SiO$_2$ | L11 |
| 22 | 1454.196 | 64.680 | 247.574 | He | |
| 23 | −391.086 | −64.680 | 272.060 | He | Mc |
| 24 | 1458.196 | −25.000 | 244.168 | SiO$_2$ | L11 |
| 25 | −232.353 | −75.379 | 220.779 | He | |
| 26 | −468.166 | −40.000 | 217.728 | SiO$_2$ | L10 |
| 27 | 7584.087 | −20.589 | 212.029 | He | |
| 28 | −362.674 | −50.000 | 200.906 | CaF$_2$ | L9 |
| 29 | 487.738 | −0.500 | 189.633 | He | |
| 30 | −741.786 | −20.000 | 175.559 | SiO$_2$ | L8 |
| 31 | −175.047 | −94.695 | 153.717 | He | |
| 32 | 210.390 | −20.000 | 120.004 | SiO$_2$ | L7 |
| 33 | 321.289 | −273.325 | 118.913 | He | |
| 34 | 8614.877 | −20.000 | 27.368 | SiO$_2$ | L6 |
| 35 | −1065.315 | −7.433 | 22.901 | He | |
| 36 | 2531.555 | −30.000 | 21.081 | SiO$_2$ | L5 |
| 37 | 349.710 | −18.090 | 15.943 | Air | |
| 38 | ∞ | 235.000 | 7.839 | Air | Mp1 |
| 39 | 3152.995 | 25.000 | 72.461 | SiO$_2$ | L12 |
| 40 | −866.064 | 0.500 | 76.244 | Air | |
| 41 | 667.058 | 27.938 | 78.996 | SiO$_2$ | L13 |
| 42 | 54371.205 | 300.000 | 82.371 | Air | |
| 43 | ∞ | −200.153 | 113.263 | Air | Mp2 |
| 44 | −333.661 | −50.022 | 186.802 | CaF$_2$ | L14 |
| 45 | 932.321 | −10.459 | 187.613 | He | |
| 46 | 465.651 | −25.000 | 187.726 | SiO$_2$ | L15 |
| 47 | −951.150 | −251.611 | 187.421 | He | |
| 48 | −307.613 | −30.000 | 229.921 | SiO$_2$ | L16 |
| 49 | −1088.361 | −15.002 | 227.490 | He | |
| 50 | — | −59.004 | 225.931 | He | AS |
| 51 | −289.836 | −25.000 | 212.018 | SiO$_2$ | L17 |
| 52 | −904.069 | −0.500 | 207.596 | He | |
| 53 | −233.576 | −26.100 | 199.703 | SiO$_2$ | L18 |
| 54 | −715.902 | −20.714 | 192.933 | He | |
| 55 | 472.711 | −30.000 | 188.317 | SiO$_2$ | L19 |
| 56 | −2283.014 | −15.487 | 173.680 | He | |
| 57 | −353.837 | −50.000 | 161.687 | SiO$_2$ | L20 |
| 58 | 1558.935 | −0.500 | 141.698 | He | |
| 59 | −125.163 | −23.577 | 124.866 | SiO$_2$ | L21 |
| 60 | −263.069 | −3.884 | 112.611 | He | |
| 61 | −333.794 | −20.000 | 109.463 | CaF$_2$ | L22 |
| 62 | −81.724 | −7.293 | 82.279 | He | |
| 63 | −85.000 | −60.000 | 77.371 | SiO$_2$ | L23 |
| 64 | −1465.290 | −18.811 | 31.854 | Air | |
| 65 | ∞ | | 0.000 | | W |

Figure 2A:
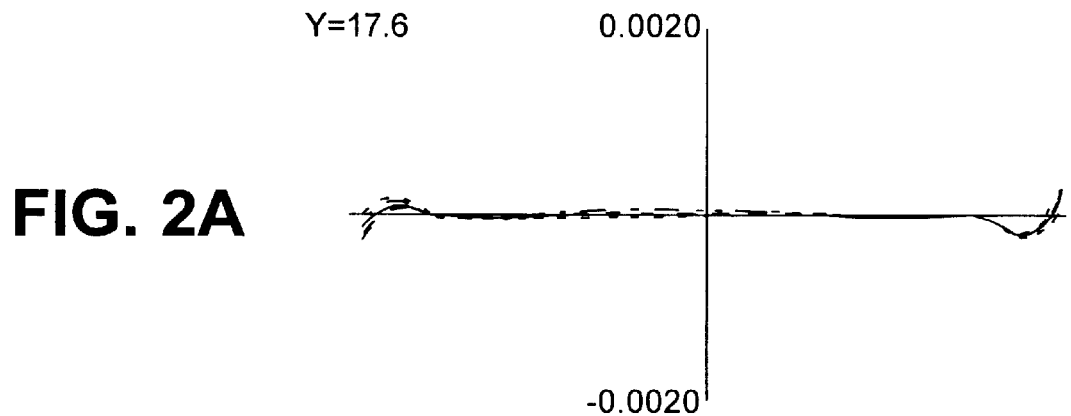
FIG. 2 shows transverse aberrations in the projection-optical system of the first embodiment with different values of Y.
Figure 2B:
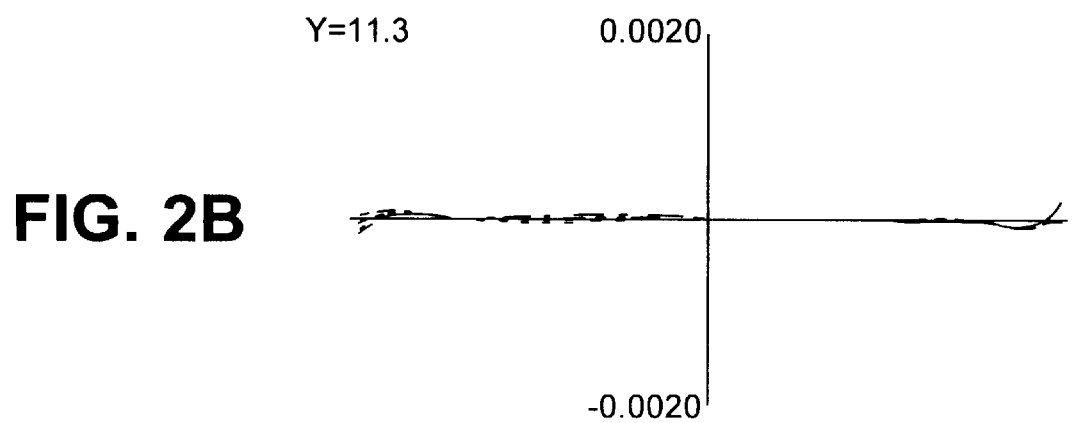
Figure 2C:
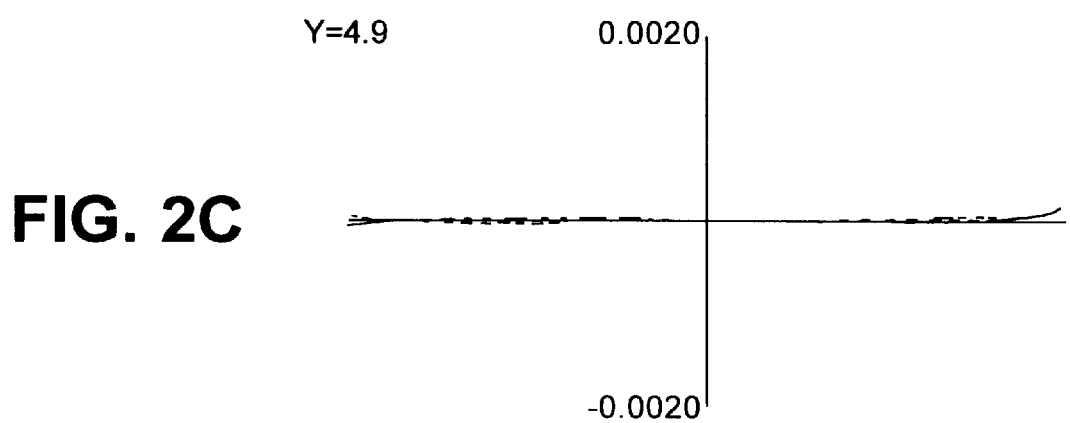
Figure 4A:
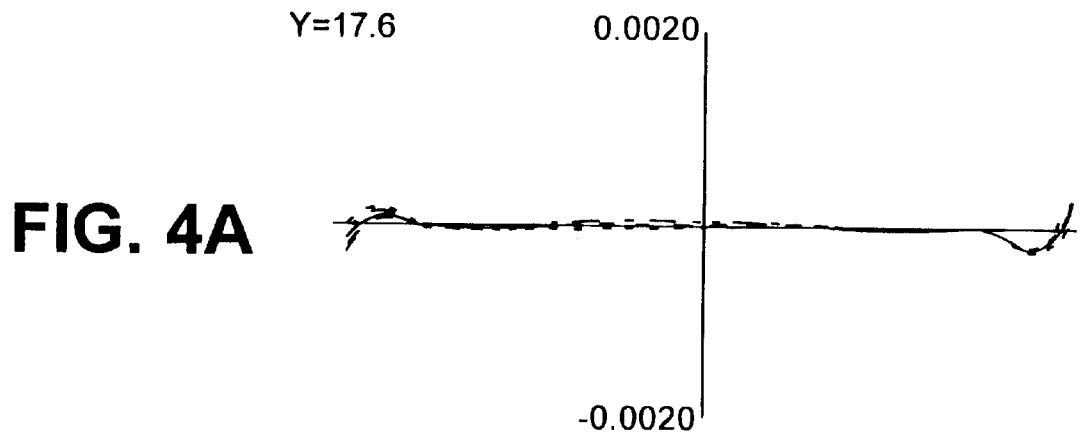
FIG. 4 shows transverse aberrations in the projection-optical system of the first embodiment with different values of Y.
Figure 4B:
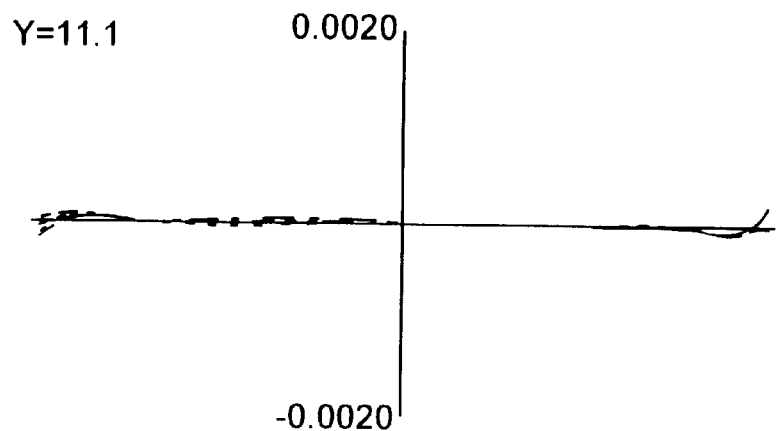
Figure 4C:
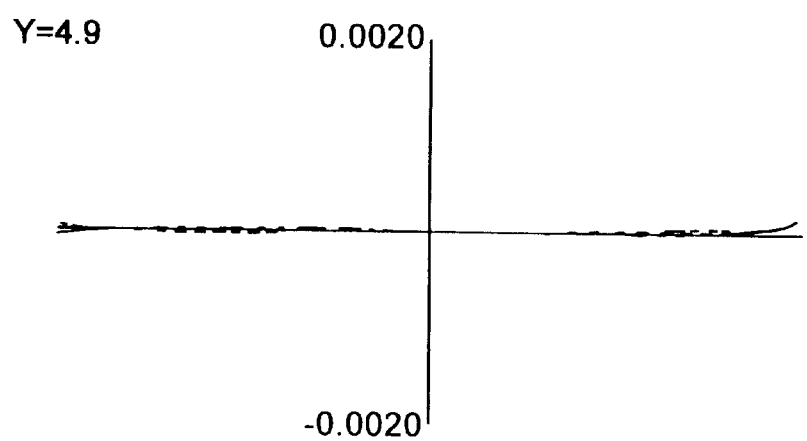

FIGS. 2 and 4 show the transverse aberrations of the projection-optical system according to the first and second embodiments, respectively. In the figures, Y denotes the image height. As is clear from the figures, in the helium environment, both systems exhibit superior image qualities, while satisfying condition (1).

Although, in the embodiments, the present invention is applied to the projection-optical system that include a reflecting lens system, the present invention can be effectively applied to reflecting systems, reflecting/diffracting systems, and diffracting systems. The present invention is especially advantageous to a reflecting system because such a system includes a two-way optical path, and because the total length and the diameter of the luminous flux are apt to increase.

The exposure apparatus of the present invention can reduce gas fluctuation even if the length of the optical path through gas is relatively long, and even if the diameter of light flux through the gas is relatively large, a high-quality image can be formed with reduced with little influence of quiver of the air and reduced wavefront aberration.

While the invention has been described by way of exemplary embodiments, it is understood that the invention is not limited to the particulars disclosed. The invention extends to all equivalent structures, components, means and uses that are properly within the spirit and the scope of the invention, which will be apparent for those skilled in the art.

We claim:

1. An exposure apparatus with a projection-optical system for transferring an image of a pattern formed on a mask onto a photosensitive substrate, comprising a number of gas sections positioned along an optical axis within an optical path from the mask to the photosensitive substrate, the projection-optical system satisfying the condition:

$$(1/\lambda)\sum_i (Li)^{1/2} \cdot Ri > 1.39 \cdot 10^6 \quad (m^{1/2})$$

where $\lambda$ is a wavelength of exposure light used in the apparatus, Li is a length of a gas section i along the optical axis, in m, $\Sigma i$ is a summary of i gas sections within the optical path from the mask to the photosensitive substrate, and Ri is an average of a mask-side diameter and a substrate-side diameter of a light flux in each gas section, the light flux emerging from a maximum image height and advancing within meridional plane, wherein at least one of the gas sections containing helium or neon.

2. The exposure apparatus according to claim 1, further including means for supplying and discharging helium or neon to and from the gas sections.

3. The exposure apparatus according to claim 1, wherein the gas sections filled with helium or neon satisfy the condition $$x > 200(n_a-n)/3(n_a-n)$$

where x is a partial pressure (%) of helium or neon, n is index of refraction of helium or neon, and $n_a$ is index of air refraction.

4. The exposure apparatus according to claim 1, wherein the wave length $\lambda$ of the exposure light used in the apparatus satisfy the condition:

$$\lambda \leq 300nm$$

where $\lambda$ is a wavelength of exposure light used in the apparatus.

5. The exposure apparatus according to claim 1, wherein total pressure of each gas section filled with helium or neon is lower than or equal to atmospheric pressure.

6. The exposure apparatus according to claim 5, wherein the gas sections filled with helium or neon are airtight sealed with elastomer.

7. The exposure apparatus according to claim 2, wherein the gas sections filled with helium or neon satisfy the condition:

$$x > 200(n_a-n)/3(n_a-n)$$

where x is partial pressure (%) of helium or neon, n is index of refraction of helium or neon, and $n_a$ is index of air refraction.

8. The exposure apparatus according to claim 7, wherein total pressure of each air gap filled with helium or neon is lower than or equal to the atmospheric pressure.

9. The exposure apparatus according to claim 8, wherein the gas sections filled with helium or neon are airtight sealed with elastomer.

10. The exposure apparatus according to claim 9, wherein the wave length λ of the exposure light used in the apparatus satisfy the condition:

$$\lambda \leq 300 nm$$

where λ is a wavelength of exposure light used in the apparatus.

11. An exposure apparatus with a projection-optical system for transferring an image of a pattern formed on a mask onto a photosensitive substrate, comprising a reflecting optical element and a number of gas sections positioned along an optical axis, the projection-optical system satisfying the following condition:

$$(1/\lambda)\sum_i (Li)^{1/2} \cdot Ri > 1.39 \cdot 10^6 \quad (m^{1/2})$$

where λ is a wavelength of exposure light used in the apparatus, Σi is a summary of gas sections i in an optical path from the mask to the photosensitive substrate, Li is a length of a gas section i along the optical axis, in m, and Ri is an average of a mask-side diameter and a substrate-side diameter of a light flux in each gas section, the light flux emerging from a maximum image height and advancing within meridional plane, wherein at least one gas section i is filled with helium or neon.

12. The exposure apparatus according to claim 11, further including means for supplying and discharging helium or neon from the gas sections.

13. The exposure apparatus according to claim 11, wherein the gas sections filled with helium or neon satisfy the condition $$x > 200(n_a-n)/3(n_a-n)$$

where x is a partial pressure (%) of helium or neon, n is index of refraction of helium or neon, and $n_a$ is index of refraction of the air.

14. The exposure apparatus according to claim 11, wherein the wave length λ of the exposure light used in the apparatus satisfy the condition:

$$\lambda \leq 300 nm$$

where λ is a wavelength of exposure light used in the apparatus.

15. The exposure apparatus according to claim 11, wherein the total pressure of each air gap filled with helium or neon is lower than or equal to the atmospheric pressure.

16. The exposure apparatus according to claim 11, wherein the gas sections filled with helium or neon are airtight sealed with elastomer.

17. The exposure apparatus according to claim 12, wherein the gas sections filled with helium or neon satisfy the condition $$x > 200(n_a-n)/3(n_a-n)$$

where x is partial pressure (%) of helium or neon, n is index of refraction of helium or neon, and $n_a$ is index of air refraction.

18. The exposure apparatus according to claim 13, wherein the wave length λ of the exposure light used in the apparatus satisfy the condition:

$$\lambda \leq 300 nm$$

where λ is a wavelength of exposure light used in the apparatus.

19. The exposure apparatus according to claim 17, wherein the wave length λ of the exposure light used in the apparatus satisfy the condition:

$$\lambda \leq 300 nm$$

where λ is a wavelength of exposure light used in the apparatus.

20. The exposure apparatus according to claim 19, wherein the total pressure of each air gap filled with helium or neon is lower than or equal to the atmospheric pressure.

* * * * *